United States Patent
Wu et al.

(10) Patent No.: US 7,138,318 B2
(45) Date of Patent: Nov. 21, 2006

(54) METHOD OF FABRICATING BODY-TIED SOI TRANSISTOR HAVING HALO IMPLANT REGION UNDERLYING HAMMERHEAD PORTION OF GATE

(75) Inventors: Donggang David Wu, Austin, TX (US); Wen-Jie Qi, Austin, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 10/447,047

(22) Filed: May 28, 2003

(65) Prior Publication Data

US 2004/0241969 A1 Dec. 2, 2004

(51) Int. Cl.
*H01L 21/336* (2006.01)
(52) U.S. Cl. .................. 438/289; 438/302; 438/525
(58) Field of Classification Search ........ 438/182–181, 438/174, 180, 184, 185, 289, 290–291, 299, 438/301, 302–303, 306, 307, 514, 517–519, 438/521, 525–527, 529, 574–579; 257/344, 257/408, 347
See application file for complete search history.

(56) References Cited

U.S. PATENT DOCUMENTS

| | | | |
|---|---|---|---|
| 5,492,847 A * | 2/1996 | Kao et al. | 438/302 |
| 5,811,855 A * | 9/1998 | Tyson et al. | 257/349 |
| 5,821,575 A * | 10/1998 | Mistry et al. | 257/281 |
| 5,874,329 A | 2/1999 | Neary et al. | |
| 5,920,093 A * | 7/1999 | Huang et al. | 257/347 |
| 5,973,364 A * | 10/1999 | Kawanaka | 257/347 |
| 5,985,726 A * | 11/1999 | Yu et al. | 438/301 |
| 6,005,285 A * | 12/1999 | Gardner et al. | 257/607 |
| 6,191,449 B1 | 2/2001 | Shino | |
| 6,194,278 B1 * | 2/2001 | Rengarajan | 438/302 |
| 6,309,933 B1 * | 10/2001 | Li et al. | 438/291 |
| 6,399,989 B1 * | 6/2002 | Dockerty et al. | 257/347 |
| 6,448,163 B1 * | 9/2002 | Holbrook et al. | 438/585 |
| 6,596,554 B1 * | 7/2003 | Unnikrishnan | 438/180 |
| 6,630,376 B1 * | 10/2003 | Krishnan et al. | 438/199 |
| 6,703,280 B1 * | 3/2004 | Kim et al. | 438/301 |
| 6,794,717 B1 * | 9/2004 | Matsumoto et al. | 257/347 |
| 2002/0149058 A1 | 10/2002 | Culp et al. | |
| 2003/0052347 A1 | 3/2003 | Fung | |

FOREIGN PATENT DOCUMENTS

EP 497216 A2 1/1992

(Continued)

*Primary Examiner*—Zandra V. Smith
*Assistant Examiner*—Khanh Duong

(57) ABSTRACT

A method for fabricating a body-tied SOI transistor with reduced body resistance is presented. During the wafer fabrication process, a semiconductor wafer is placed in an ion implantation device and oriented to a first position relative to a beam path of the ion implantation device in order to obtain a substantially non-orthogonal twist orientation between the beam path and the transistor gate edge. Following this orientation of the first position, an ion species is implanted into a first implantation region. The wafer is then rotated to a second substantially non-orthogonal twist orientation, where another ion implantation is conducted. This process continues in the same manner, such that further substantially non-orthogonal twists and ion implantations are conducted, until the desired number of implantation areas is created. Halo or pocket implants are an example of the type of implantations to which the technique may be applied.

22 Claims, 6 Drawing Sheets

FOREIGN PATENT DOCUMENTS

| | | |
|---|---|---|
| EP | 497216 A3 | 1/1992 |
| EP | 535917 A2 | 9/1992 |
| EP | 535917 A3 | 9/1992 |
| EP | 905789 A1 | 6/1996 |
| EP | 899793 A2 | 6/1998 |
| EP | 899793 A3 | 6/1998 |

* cited by examiner

METHOD OF FABRICATING BODY-TIED SOI TRANSISTOR HAVING HALO IMPLANT REGION UNDERLYING HAMMERHEAD PORTION OF GATE

BACKGROUND

1. Field of the Invention

The present disclosure relates generally to semiconductor fabrication, and more particularly to ion implantation processes during semiconductor fabrication.

2. Description of the Related Art

Semiconductor-on-insulator (SOI) structures have advantages over conventional bulk substrates such as elimination of latch-up, reduced short-channel effects, improved radiation hardness, and dynamic coupling, among others. Because of these advantages, semiconductor device manufacturers commonly form metal-oxide semiconductor field effect transistors (MOSFETs) on SOI structures.

In a typical MOSFET, a source and a drain are formed in an active semiconductor region by implanting N-type or P-type impurities in the layer of semiconductor material. Between the source and the drain is a channel (or body) region, above which is a gate electrode. Unfortunately, MOSFETs formed on SOI structures often experienced a floating body effect (FBE), which lead to the development of tied-body construction techniques, particularly in the manufacture of partially-depleted SOI devices such as the t-type or "hammer head" gate electrode seen in FIG. 1.

FIG. 1 illustrates a top view of a typical t-type gate transistor 100 according to the prior art. This t-type gate transistor is also known as a "hammerhead" transistor, because the shape of the block of the polysilicon portion 10 between the gate 9 and the contact 3 in region 4 resembles a hammerhead. Transistor 100 is formed in an active area having a first region 2, having a first width, and a second region 4, having a second width. Contacts 3 are located in the region 2 and contact 5 is formed in region 4. Another view of t-type gate transistor 100 is shown in FIG. 2.

FIG. 2 illustrates a cross-sectional view of t-type transistor 100 Line A of FIG. 1, while FIG. 3 illustrates a more detailed plan view of a portion of transistor 100. Line A is a cross-section just inside the gate 9 sidewall. This cross-section results in the source/drain (S/D) extensions 8 and halo implants 6 underlying the edge of the gate 9 being shown. From FIG. 2, it is seen that transistor 100 utilizes partially depleted SOI manufacturing technology. Components in FIG. 2 not illustrated in FIG. 1 include isolation structures 18, insulator layer 11, substrate 12, dielectric layer 17, source/drain (S/D) extension 8 underlying the gate 9, and halo implant 6, underlying the gate 9.

While tied-body transistors such as t-type transistor 100 avoid FBE problems by tying the transistor body to a contact CMOS scaling, has resulted in increased resistance due to attendant reductions in the cross-sectional dimensions of certain conductive structures, as well as other factors. In t-type transistor 100, there are several components of body resistance: a) contact 5 resistance, b) resistance along the width of the transistor 100 under the gate structure 9, and c) pinch off resistance under the hammer head 10 along the boundary of the body tie implant from transistor S/D implant.

Of the three resistance components named above, the contact resistance is generally the smallest portion of the total resistance. The resistance along the width of the gate structure 9 is decreased somewhat by the halo implant 6, also known as pocket implants, which normally receives a dopant dose level about one order of magnitude greater than the well implant dose level. Well implant doses are trending downward in current manufacturing technology, which has led to an increase in resistance under the polysilicon hammer head 10 such that this resistance component has begun to dominate the body resistance.

In addition, resistance problems can be exacerbated by depletion phenomena, such as when source/drain extension depletion areas create a "pinch off" under the hammerhead 10, as shown in FIG. 3. FIG. 3 is an enlargement of a portion of the t-type transistor 100 of FIG. 1 near the hammer head 10. From FIG. 3, the depletion areas 13 near the hammer head 10 of S/D extensions have created a pinch off region 14 in the channel under the hammerhead 10, which results in increased resistance. This phenomenon is illustrated from another perspective in FIG. 4.

FIG. 4 illustrates a cross-sectional view of a portion 100 of a t-type transistor along the point indicated by Line B in FIG. 1. The pinch off region 14 as created by the overlapping depletion areas 13 is plainly seen. The gate width 7 is indicated by the dashed lines appearing in the hammerhead 10 cross section. Note that the two depletion areas do not need to overlap, as illustrated, to result in an increased resistance due to pinch off.

Therefore, a method which overcomes these problems and limitations would be useful.

BRIEF DESCRIPTION OF THE DRAWINGS

The present disclosure may be better understood, and its numerous features and advantages made apparent to those skilled in the art by referencing the accompanying drawings. It will be appreciated that for simplicity and clarity of illustration, elements illustrated in the figures have not necessarily been drawn to scale. For example, the dimensions of some of the elements are exaggerated relative to other elements for clarity. Other advantages, features and characteristics of the present disclosure, as well as methods, operation and functions of related elements of structure, and the combinations of parts and economies of manufacture, will become apparent upon consideration of the following description and claims with reference to the accompanying drawings, all of which form a part of the specification, wherein like reference numerals designate corresponding parts in the various figures, and wherein:

DESCRIPTION OF THE PREFERRED EMBODIMENT(S)

The present disclosure provides a method for ion implantation for producing transistors such as a t-type transistor with reduced body resistance. The method comprises the steps of placing a semiconductor wafer comprising a gate edge in an ion implantation device. The semiconductor wafer is then oriented to a first position relative to a beam path of the ion implantation device in order to obtain a substantially non-orthogonal twist orientation between the beam path and the gate edge. Following this orientation to the first position, at least one ion species, for example an n-type or p-type dopant, is implanted into a first implantation region of the wafer. The wafer is then rotated to a second substantially non-orthogonal twist orientation, where another ion implantation is conducted. This process continues in the same manner, such that further substantially non-orthogonal twists and ion implantations are conducted, until the desired number of implantation areas is created.

The method overcomes the limitations of previous implantation methods by preventing an increase in resistance caused by depletion regions associated with S/D extensions overlapping in the region between the contact and gate channel in body-tied SOI transistors. The method thus reduces the total body resistance in a transistor, which increases the overall performance characteristics of the device. In addition, the present method is appropriate for integration into existing manufacturing process lines for advanced sub-micron integrated circuit semiconductor devices without the requirement for additional capital expenditures.

The present disclosure is best understood with a reference to the specific embodiments illustrated in FIGS. 5 through 8. It should be noted, however, that the examples described are not intended to impose a limitation on the types of devices or process flows to which the teachings of the present disclosure may be applied. Various devices and fabrication processes utilizing ion implantation of dopants are known in the art, and many would benefit from a cost-effective process in which the suppression or reduction of resistance in the path between the contact (such as contact in FIG. 5) and the gate channel created by the overlap of depletion regions associated with S/D diffusion areas as disclosed herein.

Figure 1:
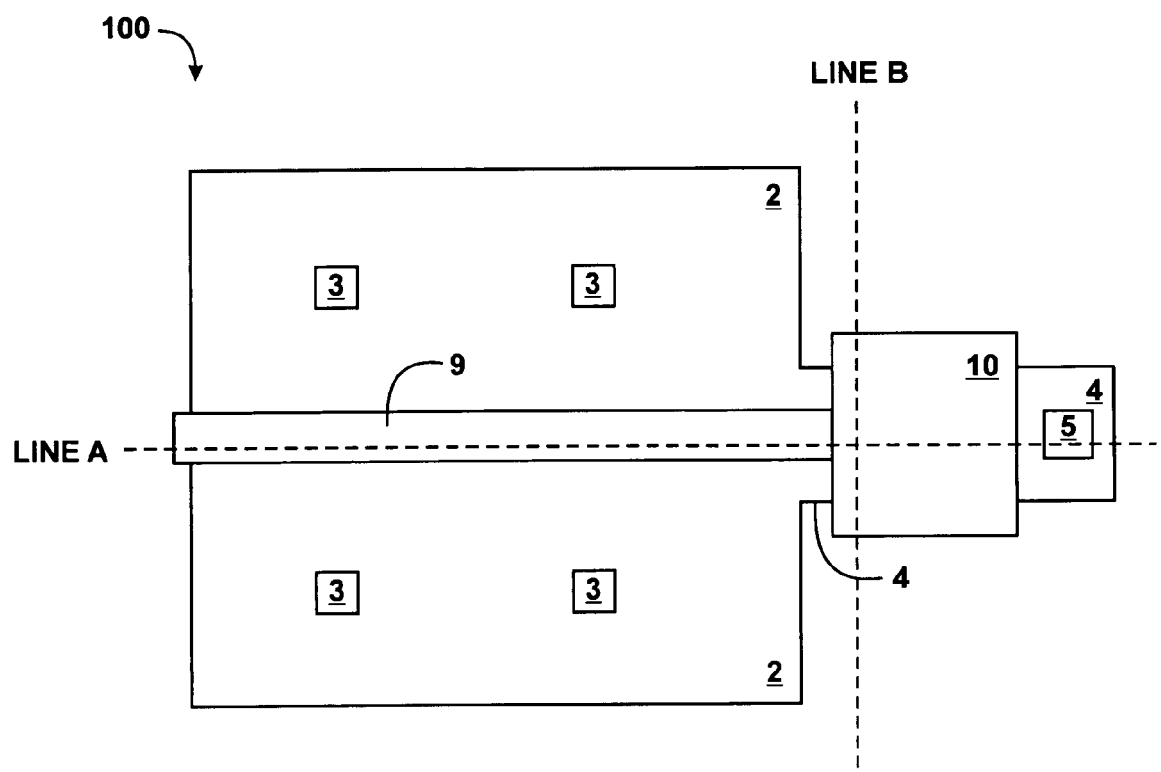
FIG. 1 is a top view of a t-type gate transistor according to the prior art.
Figure 2:
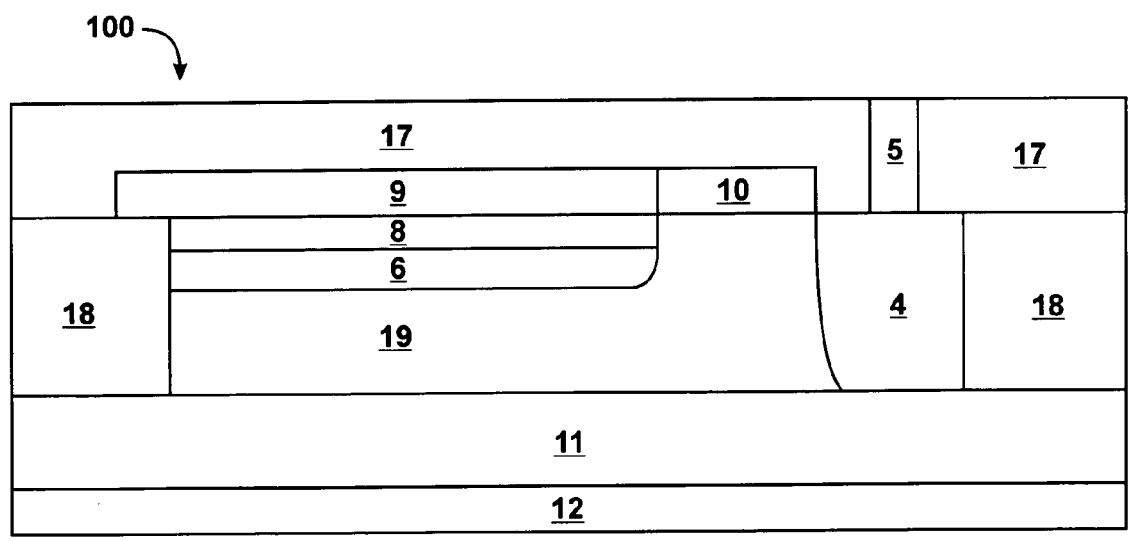
FIG. 2 is a prior art, cross-sectional view of t-type transistor along the area indicated by Line A in FIG. 1.
Figure 3:
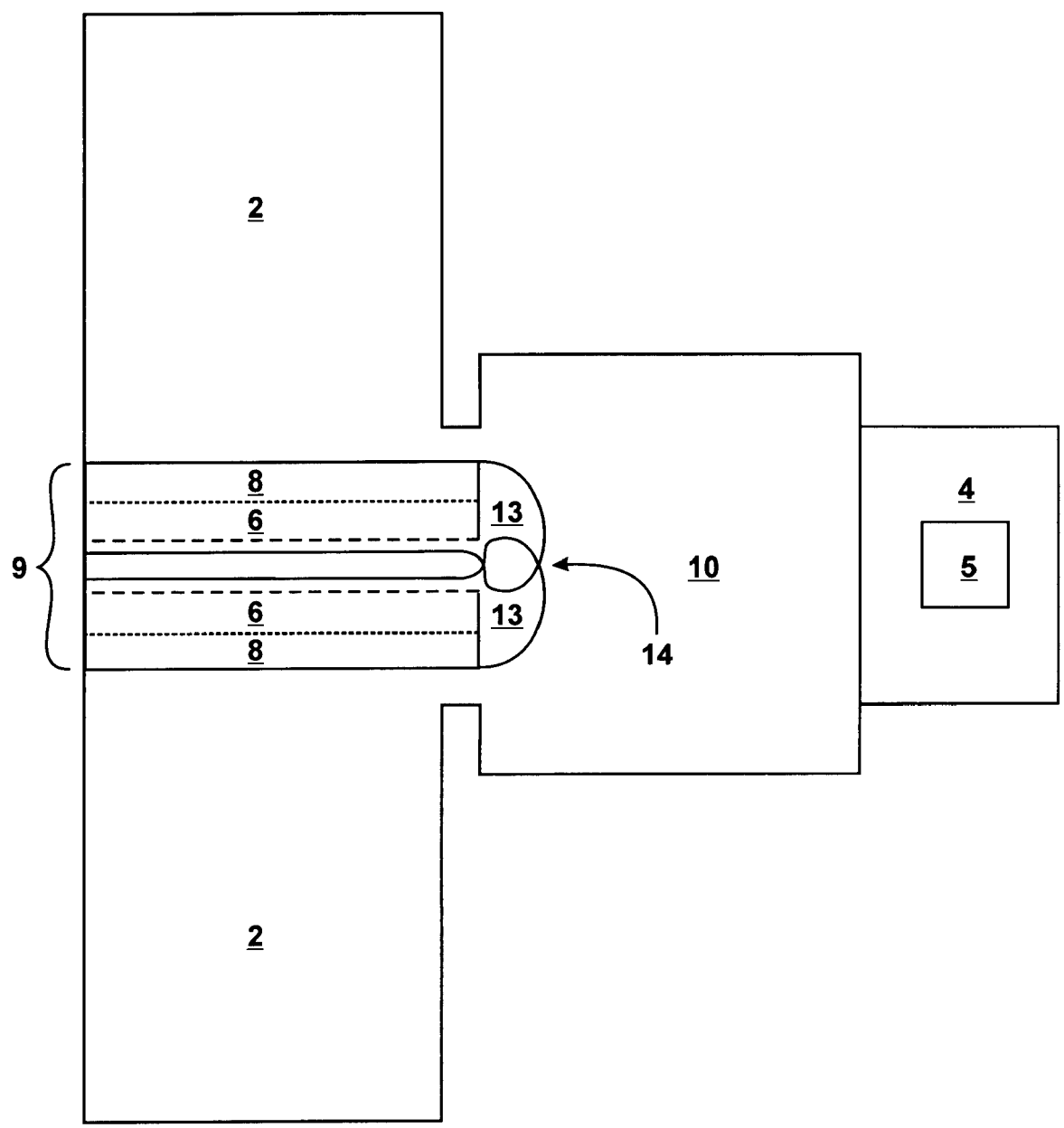
FIG. 3 is an enlargement of the top view of a portion of the prior art t-type transistor of FIG. 1.
Figure 5:
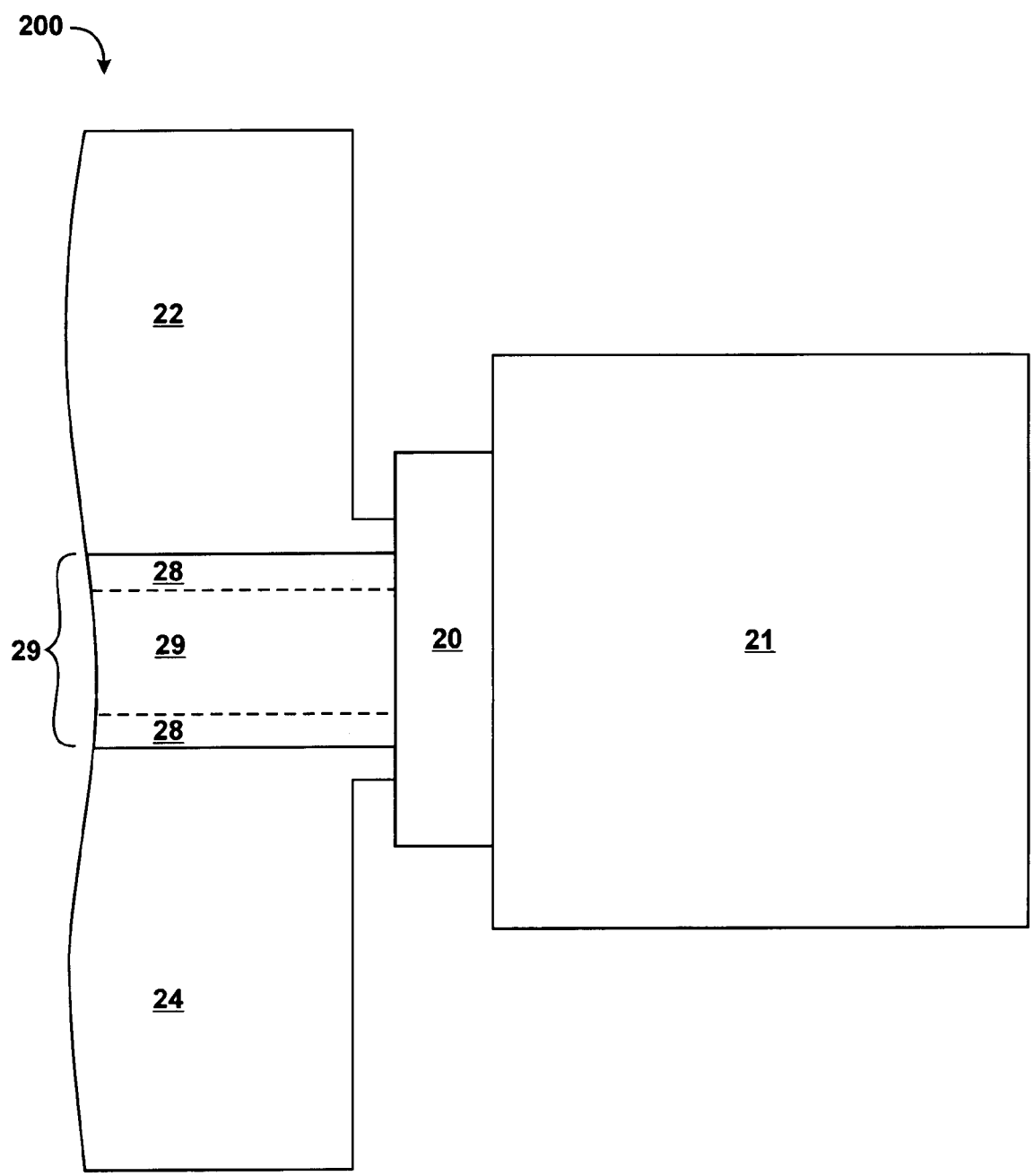
FIG. 5 illustrates a top view of a portion of a t-type transistor showing the source/drain extension implants created in a fabrication process according to one embodiment of the present disclosure.

FIG. 5 illustrates a top view of a portion 200 of a t-type transistor on a semiconductor wafer having a gate portion 29 and a hammerhead portion 20, and source/drain portions 22 and 24. Also shown in FIG. 5 is a mask layer 21 overlying the active region 24 that is analogous to region 4 of FIG. 1. The S/D extension 28 implantation is generally accomplished according to techniques known in the art, with doses ranging from $10^{12}$ cm$^{-2}$ to $10^{16}$ cm$^{-2}$. A typical S/D extension dose is on the order of a $10^{14}$ cm$^{-2}$ to $10^{15}$ cm$^{-2}$ range. As seen in FIG. 5, the source/drain extensions 28 extend to the edge of the hammerhead 20. Following the S/D extension 28 implantation indicated in FIG. 5, the halo implantation occurs, as shown in FIG. 6, with the results further illustrated by FIGS. 7 and 8.

Figure 6:
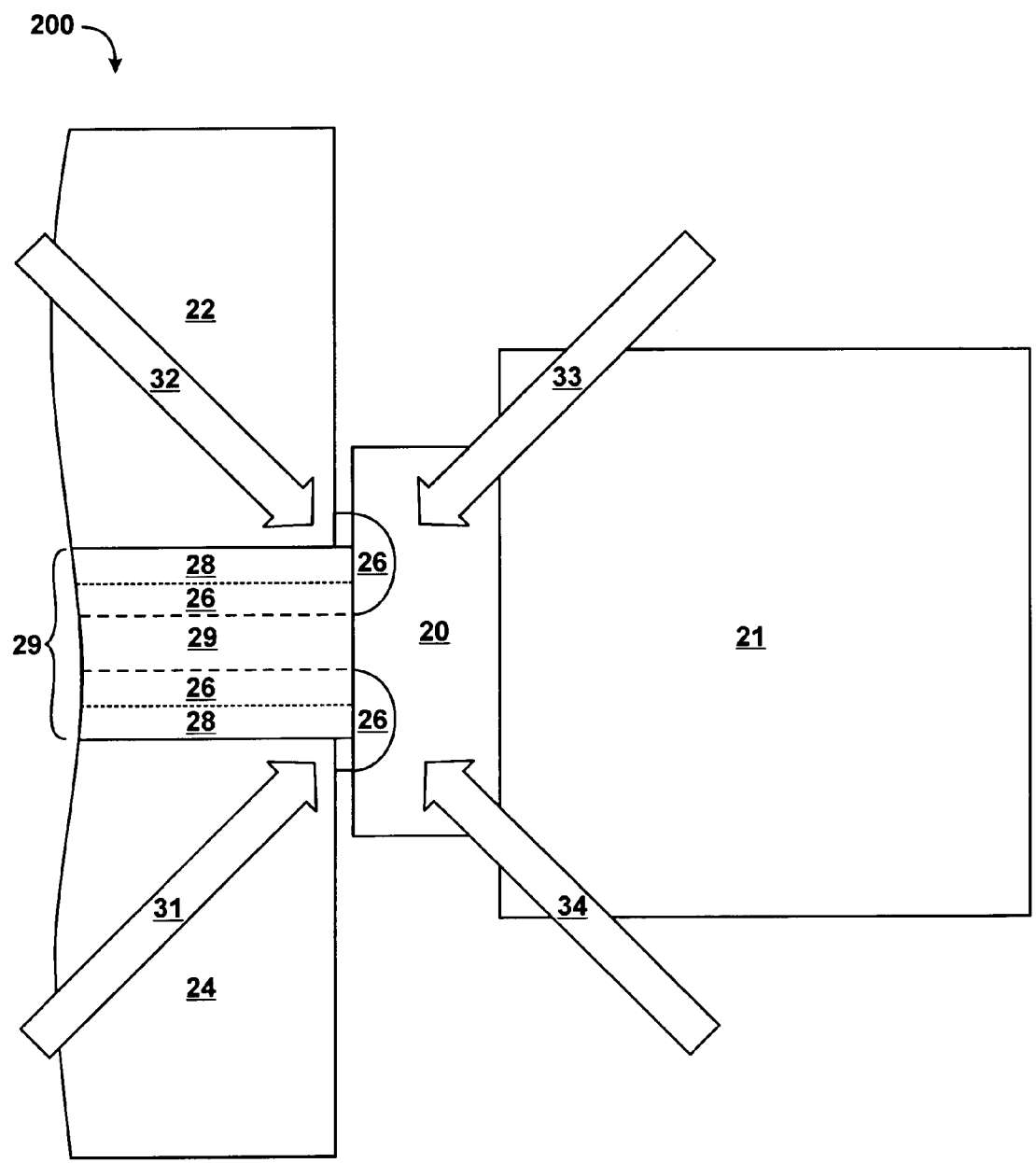
FIG. 6 illustrates a top view of the creation of halo regions in a transistor device according to at least one embodiment of the present disclosure.

FIG. 6 illustrates a top view of the creation of the halo regions 26 in portion 200. In an embodiment, the semiconductor wafer is oriented to a first position relative to an ion beam path, as indicated by arrow number 31. The purpose of this orientation is to obtain a substantially non-orthogonal twist orientation between the beam path 31 and the gate structure 29 edge. The term twist or twist orientation as used herein may be thought of as analogous to the horizontal yaw axis of an aircraft, that is demonstrated by suspending a model aircraft in a level condition by a wire located at the center of gravity. Left or right movement of the nose of the aircraft occurs along the horizontal yaw axis.

Following twist orientation to the first position, an n-type or p-type dopant is implanted into a first implantation region of transistor portion 200 of the wafer. This implantation results in the creation of an initial portion of a halo or pocket implant region 26 located in the active region under hammerhead 20 of the transistor device portion 200 beyond that of the S/D extension. Additional rotations of portion 200 to beam paths indicated by the arrows numbered 32, 33, and 34 in FIG. 6, are then carried out, with respective halo implantations occurring at each of the non-orthogonal twist orientations. In this manner, an overlap between regions of halo regions 26 under the hammerhead 20 can be obtained, as illustrated by regions 26' of FIG. 6, or a non-overlap between regions, as illustrated by regions 26, can be obtained. For example, the second implantation region may overlap the first implantation region; the third may overlap the fourth, and so on. Photoresist block 21 can be removed following completion of pocket implantation, extension implantation, and deep source implantation, or when no longer required.

In an embodiment, the ion species utilized during halo region 26 implantation is a n-type dopant such as elements located in group 15 (VA) of the periodic table, e.g., phosphorus (P). In another embodiment, the ion species implanted is a p-type dopant, e.g., elements found in group 13 (IIIA) of the periodic table, such as boron (B). These pocket implantations occur at medium beam currents and energies. For example, for boron (B), the beam energy ranges from 7 keV to 15 keV, while the beam energy ranges for arsenic (As) are from 40 keV to 90 keV. The halo or pocket implantation dose can range from $10^{13}$ cm$^{-2}$ to $10^{15}$ cm$^{-2}$, with $10^{13}$ cm$^{-2}$ being a typical delivered dose.

The substantially non-orthogonal twist orientation can be 45 degrees relative to the gate 29 edge, as seen in FIG. 6. In one embodiment, the substantially non-orthogonal twist orientation can range between 30 degrees and 60 degrees. In a further embodiment, the substantially non-orthogonal twist orientation can be between 15 degrees and 75 degrees. The substantially non-orthogonal twist orientation is chosen based upon the desired result, which involves consideration of the geometry of the features for which implants such as halo implantation region 26 are needed.

Figure 7:
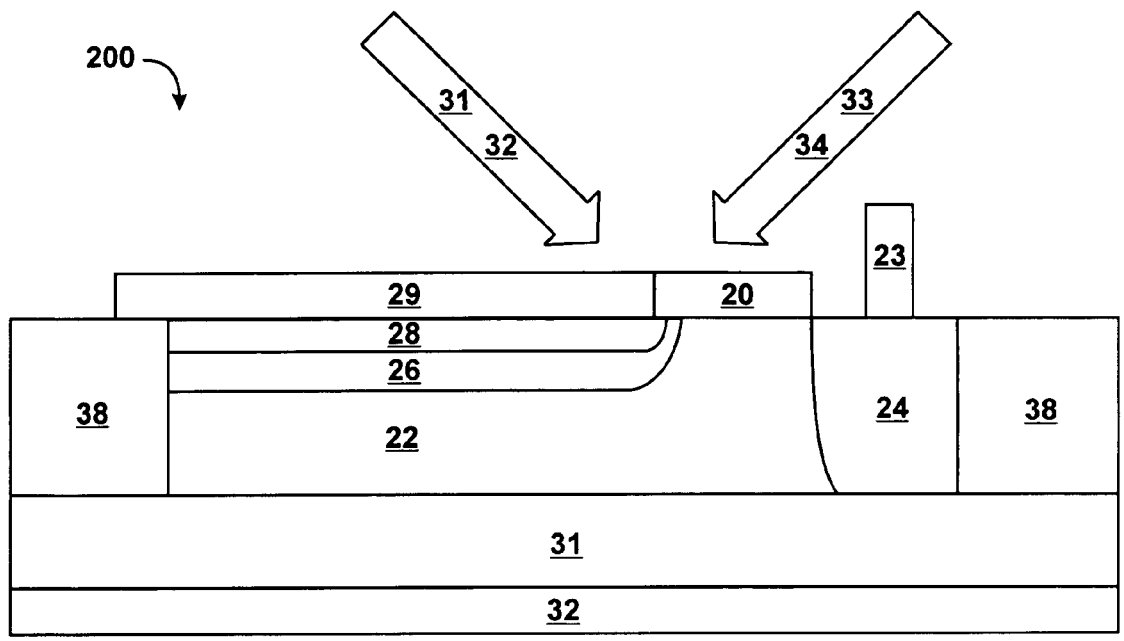
FIG. 7 illustrates a cross-sectional view of a portion of a t-type transistor device fabricated according to at least one embodiment of the present disclosure.

FIG. 7 illustrates a cross-sectional view of portion 200 of a t-type transistor device according to an embodiment of the present disclosure. The cross-sectional view of FIG. 7 is similar to that which would be obtained by dissection across the area indicated by Line A in FIG. 1. The example presented in FIG. 7 is that of an SOI transistor employing partially depleted SOI manufacturing technology. Components in FIG. 7, which were not illustrated in FIG. 6, include isolation structures 38, insulator layer 31, substrate 32, and active regions 22 and 24. The beam paths are illustrated for reference purposes, even though the masking layer 21 has been removed.

As seen in FIG. 7, the halo region 26 extends under a portion of the hammerhead 20 of gate structure 29. This has the effect of constraining the depletion 53 of S/D depletion region and suppressing pinch-off, as seen in FIG. 8.

Figure 4:
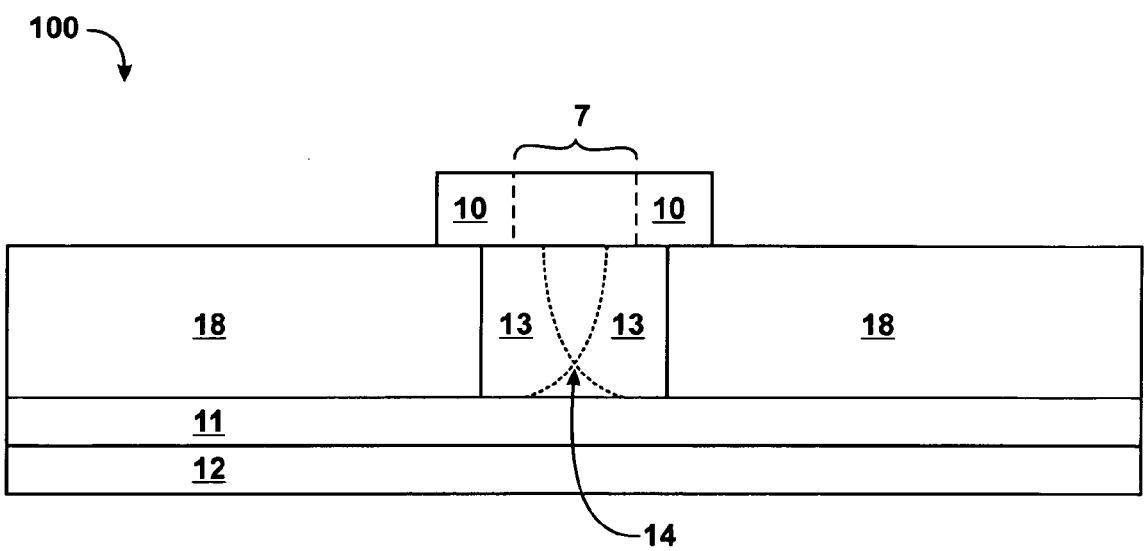
FIG. 4 illustrates a cross-sectional view of a prior art, t-type transistor along the point indicated by Line B in FIG. 1.
Figure 8:
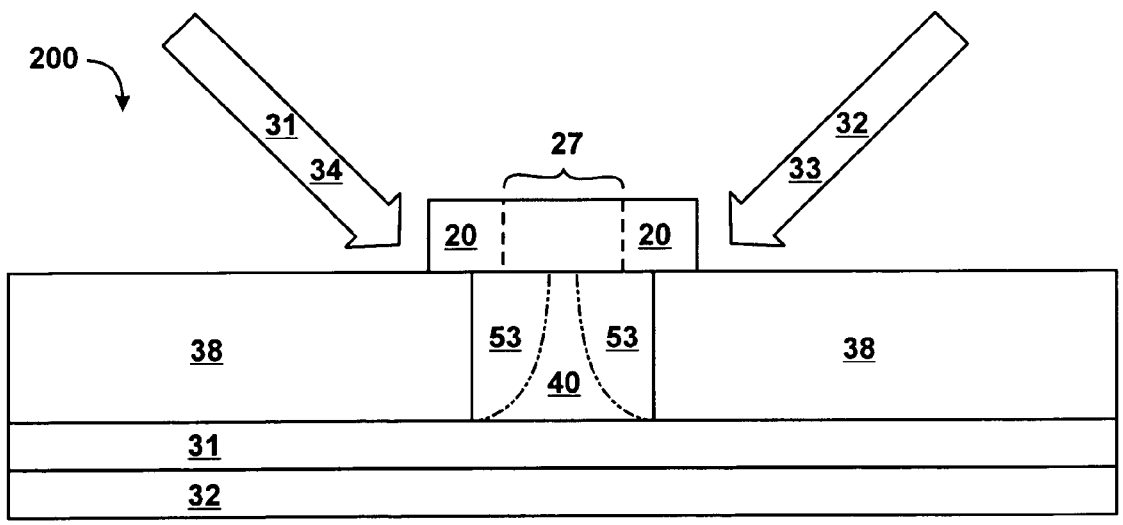
FIG. 8 illustrates a cross-sectional view of a portion of a t-type transistor device fabricated according to at least one embodiment of the present disclosure.

FIG. 8 illustrates a cross-sectional view of a portion of a t-type transistor device fabricated according to an embodiment of the present disclosure. The cross-sectional view of FIG. 8 is similar to that which would be obtained by dissection across the area indicated by Line B in FIG. 1. The S/D depletion region 53 is pulled back such that a depletion pinch off condition in the channel 40 under the hammerhead 20 is not manifested. This will result in decreased total body resistance because the resistance increase manifested by the manufacturing methods of the prior art which created a pinch off region (14, FIG. 4) are not manifested when practicing the manufacturing techniques taught herein.

The method and apparatus described herein provides for a flexible implementation. Although the invention has been described using certain specific examples, it will be apparent to those skilled in the art that the invention is not limited to these few examples. For example, the disclosure could be used to create other features not specifically illustrated. In addition, the invention can be employed with other device technologies to realize reduced resistance characteristics in implantation processes during device manufacture. Additionally, various types of ion implantation devices are currently available which could be suitable for use in employing the method as taught herein. Note also, that although an embodiment of the present invention has been shown and described in detail herein, along with certain variants thereof, many other varied embodiments that incorporate the teachings of the invention may be easily constructed by those skilled in the art. Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. Accordingly, the present invention is not intended to be limited to the specific form set forth herein, but on the contrary, it is intended to cover such alternatives, modifications, and equivalents, as can be reasonably included within the spirit and scope of the invention.

The invention claimed is:

1. A method comprising:
    placing a semiconductor wafer comprising a gate edge in an ion implantation device;
    orienting the semiconductor wafer to a first position relative to a beam path of the ion implantation device to obtain a twist orientation between the beam path and the gate edge of between 15 and 75 degrees; and
    implanting at least one ion species into a first implantation region directly under a hammerhead portion of a hammerhead transistor while the semiconductor wafer is in the first position, wherein the hammerhead portion and a gate of the hammerhead transistor are substantially formed at a same level, and from a plan view the hammerhead portion resembles a hammerhead relative to the gate.

2. The method of claim 1, further comprising:
    rotating the semiconductor wafer to a second twist orientation between the beam path and the gate edge of between 15 and 75 degrees; and
    implanting at least one ion species into a second implantation region directly under the hammerhead portion while the semiconductor wafer is in the second position.

3. The method of claim 2, wherein the second implantation region overlaps the first implantation region.

4. The method of claim 1, wherein the twist orientation is 45 degrees.

5. The method of claim 1, wherein the twist orientation is between 30 degrees and 60 degrees.

6. The method of claim 1, wherein the ion species is an n-type dopant.

7. The method of claim 1, wherein the ion species is a p-type dopant.

8. The method of claim 1, wherein implanting at least one ion species includes implanting a halo implant.

9. The method of claim 1, wherein at least a portion of the hammerhead portion is directly between a contact to active silicon of the hammerhead transistor and the gate edge.

10. The method of claim 1, wherein the hammerhead transistor further comprises an active region having a first portion and a second portion, a contact to the second portion, the gate being closer to a first edge of the hammerhead portion than the contact, the contact closer to a second edge of the hammerhead portion than the gate, and the first and second edge being substantially parallel from a plan view.

11. The method of claim 1, wherein the hammerhead portion when viewed from a plan view is at least partially between the gate and a contact to an active region of the hammerhead transistor.

12. A method comprising:
    forming a transistor device having a gate portion and a hammerhead portion, the gate portion comprising a first gate edge and a second gate edge, wherein a distance between the first gate edge and second gate edge is the gate's width, wherein the hammerhead portion relative to the gate portion resembles a hammerhead from a plan view; and
    implanting a dopant, after forming the gate portion and the hammerhead portion, underlying the hammerhead portion to form a substantially doped first region extending from a first point directly under the hammerhead portion to a second point directly under the hammerhead portion, wherein the first point is closer to the first gate edge than the second point, the second point is closer to the second gate edge than the first point and substantially none of the dopant is implanted in a region underlying the hammerhead portion between the second point and the second edge.

13. The method of claim 12, wherein implanting further comprises:
    rotating the hammerhead transistor device to a first substantially non-orthogonal twist orientation, wherein substantially non-orthogonal twist orientations are relative to a gate edge and are between 0 and 90 degrees;
    implanting the dopant into the first region of the transistor device;
    rotating the transistor device to a second substantially non-orthogonal twist orientation; and
    implanting the dopant into a second region under the hammerhead portion of the transistor device.

14. The method of claim 13, wherein the substantially non-orthogonal twist orientation is 45 degrees.

15. The method of claim 13, wherein the substantially non-orthogonal twist orientation is between 30 degrees and 60 degrees.

16. The method of claim 13, wherein the substantially non-orthogonal twist orientation is between 15 degrees and 75 degrees.

17. The method of claim 12, wherein the dopant is an n-type dopant.

18. The method of claim 12, wherein the dopant is a p-type dopant.

19. The method of claim 12, wherein implanting the dopant includes implanting a dopant to form a halo implant.

20. The method of claim 12, wherein at least a portion of the hammerhead portion is directly between a contact to active silicon of the hammerhead transistor and at least one of the first gate edge or the second gate edge.

21. A method comprising
implanting a dopant to directly underlie a first hammerhead portion of a transistor after forming the hammerhead portion wherein the dopant does not directly underlie a second hammerhead portion of the transistor; and wherein
the transistor comprises
   an active region,
   a gate portion at a location of the active region where the active region has a first width along a first dimension,
   a contact at a second location of the active region where the active region has a second width along the first dimension,
   a hammerhead portion formed between the gate portion and the contact portion when viewed from a plan view, and having a third width along the first dimension, the third width being greater than the second width.

22. The method of claim 21 wherein the third width is less than the first width.